US011462427B2

(12) United States Patent
Stein et al.

(10) Patent No.: US 11,462,427 B2
(45) Date of Patent: Oct. 4, 2022

(54) INTERFACE DEVICE FOR A PURGING UNIT FOR PURGING A WAFER CONTAINER

(71) Applicant: Fabmatics GmbH, Dresden (DE)

(72) Inventors: Bernhard Stein, Dresden (DE);
Cornelius Günther, Dresden (DE);
Udo Scheller, Dresden (DE);
Heinz-Martin Esser, Dresden (DE);
Steffen Pollack, Dresden (DE)

(73) Assignee: Fabmatics GmbH, Dresden (DE)

( * ) Notice: Subject to any disclaimer, the term of this patent is extended or adjusted under 35 U.S.C. 154(b) by 465 days.

(21) Appl. No.: 16/729,540

(22) Filed: Dec. 30, 2019

(65) Prior Publication Data

US 2020/0227296 A1    Jul. 16, 2020

(30) Foreign Application Priority Data

Jan. 10, 2019    (DE) .......................... 102019100448.9

(51) Int. Cl.
*H01L 21/673*    (2006.01)
*H01L 21/677*    (2006.01)

(52) U.S. Cl.
CPC .. *H01L 21/67393* (2013.01); *H01L 21/67766* (2013.01); *H01L 21/67775* (2013.01)

(58) Field of Classification Search
CPC ......... H01L 21/67393; H01L 21/67766; H01L 21/67775; H01L 21/67389
See application file for complete search history.

(56) References Cited

U.S. PATENT DOCUMENTS

| | | | |
|---|---|---|---|
| 6,056,026 A | 5/2000 | Fosnight et al. | |
| 6,164,664 A | 12/2000 | Fosnight et al. | |
| 2004/0237244 A1 | 12/2004 | Suzuki et al. | |
| 2007/0210533 A1 | 9/2007 | Okabe et al. | |
| 2011/0214778 A1* | 9/2011 | Natsume | H01L 21/67393 141/369 |
| 2016/0276188 A1* | 9/2016 | Morihana | H01L 21/67393 |

FOREIGN PATENT DOCUMENTS

| | | |
|---|---|---|
| JP | 2010182747 A | 8/2010 |
| KR | 1020160080053 A | 7/2016 |

* cited by examiner

*Primary Examiner* — Glenn F Myers
(74) *Attorney, Agent, or Firm* — Michael Soderman

(57) ABSTRACT

An interface device for a purging unit for purging a wafer container with a purging gas, which comprises a contact piece for contacting a purging interface of a wafer container, wherein the contact piece is movably arranged in the purging unit and has a gas passage in its interior. A corresponding interface device is provided. The object is to specify an interface device which, when the wafer container is coupled to the purging unit, makes it possible to seal a gas inlet or a gas outlet, to introduce or to discharge a purging gas into the wafer container, thereby compensating for and adapting to vertical and horizontal movements, preventing wear, and fulfilling a passive coupling and sealing function as well as offering maximum durability and reliability. This is achieved by a contact piece which is suspended directly or indirectly in the purging unit by means of a spring device.

9 Claims, 5 Drawing Sheets

INTERFACE DEVICE FOR A PURGING UNIT FOR PURGING A WAFER CONTAINER

CROSS REFERENCE TO RELATED APPLICATIONS

This application claims the priority of DE 102019100448.9 filed on Jan. 10, 2019; this application is incorporated by reference herein in its entirety.

BACKGROUND

The invention relates to an interface device for a purging unit for purging a wafer container with a purging gas, which comprises a contact piece for contacting a purging interface of a wafer container, wherein the contact piece is arranged to be fully movable in the purging unit, and has a gas passage in its interior. The invention further relates to a purging unit having a corresponding interface device.

Particle-free transport of wafers, as well as particle-free storage and processing of wafers—for the most part, silicon wafers—in a defined atmosphere is of extraordinary importance in the manufacture of semiconductors. For this purpose, the wafers are transported and stored in a wafer container, the so-called pod or—especially for pods of 300 mm—in a standardized wafer container called the FOUP (front opening unified pod), or are directly loaded from the wafer container into a corresponding processing system for processing. Between the processing steps, the wafers in the wafer containers are often additionally purged in order to eliminate contamination from the wafer containers or to store the wafers in a defined atmosphere—most commonly, in an inert gas. To do this, the wafer container must dock with a plurality of purging units, sometimes called purge nest/shelf units (PNU/PSUs), which also function as a clean storage unit or a loading unit (load port). This in turn requires an interface device to transport the purging gas between the respective purging unit and a purging interface of the wafer container.

Such interface devices are known from US Pat. No. 2004 0237244 A1 and US 2007 0210533 A1, in which a corresponding connection between a wafer container and a purging unit is achieved by means of a deformable sealing ring with suction lips and suction openings. Due to its deformability, the deformable sealing ring allows a limited compensation of vertical and horizontal movements between the wafer container and the purging unit during docking. However, due to its deformability, it also harbours the risk of breaking and/or particle abrasion. In addition, the docking process must be actively operated via the suction openings.

U.S. Pat. No. 6,056,026 in turn presents an interface device of a purging unit in which a movable piston, which is mounted on a spring, releases a gas inlet when the wafer container is connected and/or docked. This gas inlet connects to the wafer container via simple openings in the purging unit, which are bounded by sealing rings. On the one hand, such an interface device has a very complicated structure and, on the other hand, allows only a very limited vertical or horizontal movement of the wafer container during docking so that leakages thereon can easily occur.

In contrast, U.S. Pat. No. 6,164,664 describes a passive interface device between a wafer container and a purging unit. For this purpose, the interface device contains a flexible, deformable spout, which may have different shapes. When the wafer container is connected and docked, this interface device is also able to compensate for vertical and horizontal movements between the wafer container and the purging unit within limits. In addition, it does not have to be actively suctioned onto the device, since the spout is fastened in the peripheral edge of a gas inlet or a gas outlet of the purging unit, and the tight contact is established by the weight of the wafer container. However, there is a risk in this case as well of breaking and/or particle abrasion due to the general deformability of the interface device.

SUMMARY

The invention relates to an interface device (1) for a purging unit (100) for purging a wafer container with a purging gas, which comprises a contact piece (2) for contacting a purging interface of a wafer container, wherein the contact piece (2) is movably arranged in the purging unit and has a gas passage (3) in its interior. The invention further relates to a purging unit (100) with a corresponding interface device (1).

The object of the invention is to specify an interface device (1) which, when the wafer container is coupled to the purging unit (100), makes it possible to seal a gas inlet or a gas outlet, to introduce or to discharge a purging gas into the wafer container, thereby compensating for and adapting to vertical and horizontal movements, preventing wear, and fulfilling a passive coupling and sealing function as well as offering maximum durability and reliability.

This is achieved by a contact piece (2) which is suspended directly or indirectly in the purging unit (100) by means of a spring device (4).

DETAILED DESCRIPTION

It is thus the object of the present invention to specify an interface device for a purging unit for purging a wafer container, and a corresponding purging unit, which make it possible to seal a gas inlet and/or a gas outlet of a wafer container when the wafer container is coupled to the purging unit, and to introduce or to discharge a purging gas, in particular an inert gas such as nitrogen, into the wafer container. Such an interface device is to be insertable into a purging unit, also called a purge nest/shelf unit (PNU/PSU), which in turn may be part of a purging system with a plurality of storage spaces for wafer containers. The aforementioned problems should be accordingly overcome.

In particular, it is the object of the present invention to describe an interface device and a purging unit which enable
- compensating for and adapting to horizontal movements, as well as tilting movements, in addition to vertical movements during the coupling process;
- sealing the gas inlet or and/or outlet in the best possible way when gas flows (and thus backpressures) are low—that is, establishing a gas-tight or generally fluid-tight connection;
- preventing particles, as well as any abrasion, during the coupling and uncoupling process, as well as during the purging operation, or at least to significantly minimize these compared to the prior art;
- performing a passive coupling and sealing function; and
- minimizing maintenance requirements through maximum longevity, since frequent maintenance on thousands of purging units in a semiconductor factory would subsequently lead to massive cost disadvantages and competitive disadvantages.

The object is achieved according to the invention by the teaching of claim 1. Further advantageous embodiments and developments of the invention emerge from the dependent claims.

An interface device for a purging unit for purging a wafer container with a purging gas comprises a contact piece for contacting a purging interface of a wafer container. Such a purging interface of the wafer container is called the purge interface and/or grommet. An inert gas is usually fed in as the purging gas, thereby avoiding any reaction with the surface of the wafer, as well as the wafer container. The contact piece is movable in all axes and arranged in the purging unit so as to be rotatable about the axis of symmetry, and has a gas passage in its interior. In one embodiment, this gas passage extends from a top side to an underside of the contact piece.

According to the invention, the interface device is then characterized in that the contact piece is suspended directly or indirectly in the purging unit by means of a spring device. This enables a flexible, almost friction-free, floating—and thus low-particle, or particle-free—suspension of the contact piece in the purging unit. A direct suspension in the purging unit in this case describes a direct connection of one end of the spring device to the purging unit, whereas an indirect suspension is ensured by a connection of one end of the spring device with an intermediate unit between the purging unit.

In one embodiment, the spring device contains a helical spring. However, other spring devices that have properties similar to this helical spring may also be contemplated.

Due to the suspension of the contact piece, which in one embodiment has non-elastic properties and may therefore also be designed completely rigid, by means of a spring device in the purging device, vertical and horizontal movements, as well as tilting movements, during the process of coupling can be compensated for in a very simple manner: Within a defined horizontal radius, preferably deviating from the centre point by up to 2 millimetres, the interface device, in particular the contact piece of the interface device, can be contacted variably by the purging interface of the wafer container. The wafer container can be received at an angle inclined to the horizontal and/or slightly shifted horizontally. The interface device is thus configured to adapt the movements of the wafer container starting from the mutual contact of the two. For coupling the wafer container to the purging unit, 3-point kinematic couplings between the wafer container and a purging unit with a downward movement of the wafer container between 0° and 45° are customary, and these are adapted until an intended end position of the wafer container has been assumed.

The interface device according to the invention implements a fluid-tight and/or, in particular, a gas-tight connection directly between the contact piece of the interface device and the purging interface of the wafer container, which performs a passive coupling and sealing function: The coupling and sealing function is achieved by the mobility and the adaptation properties of the contact piece by means of the spring device and by the placement of the wafer container on the purging unit, and thus by the contact piece and purging interface of the wafer container being pressed against one another. The spring device is preferably designed as a helical spring which surrounds a tapered part of the contact piece and is supported between the frame and an upper segment of the contact piece which widens in the form of a disc.

Due to the mobility guaranteed by the spring device and, in one embodiment, the non-elastic design of the contact piece, a risk of leakage and the risk of particle generation can be kept to a minimum, while providing very high mobility and adaptability to the movements of the wafer container.

A further embodiment of the interface device further comprises a frame for attaching the interface device to the purging unit and for receiving the spring device for suspending the contact piece. The frame thus forms an intermediate unit between the interface device and the purging unit, and in particular between the spring device of the interface device and the purging unit. In one variant, the frame receives a spring device which contains a helical spring, or which is formed by a helical spring.

A further embodiment of the interface device is characterized by a contact piece which is configured to generate high static friction to the purging interface of the wafer container. As a result, when the contact is made, the contact piece of the interface device and the purging interface—also called the grommet—of the wafer container nestle against each other before the purging interface of the wafer container, and thus the wafer container itself, reaches its end position. The high static friction prevents a further movement of the contact piece of the interface device relative to the purging interface of the wafer container by moving synchronously with it.

Particularly advantageous is an interface device having a contact piece comprising a top side comprising a flat surface, in particular, a flat metal surface. In one embodiment, the metal surface, like all other parts of the interface device, is made of stainless steel. In such a case, a top side in the form of a flat surface which is particularly smooth and/or polished is particularly suitable: Starting from the contact of the contact piece of the interface device with the purging interface of the wafer container, there is essentially no more relative movement between the contact piece and the purging interface. This prevents the generation of particles.

Furthermore, it is advantageous if the interface device in one embodiment comprises a conical centring disc for aligning the contact piece in the purging unit and/or in the frame of the interface device along a centre axis of the interface device. The conical centring disc is directly or indirectly connected to the lower shell region of the contact piece, wherein an indirect movable connection is more conducive to increased mobility of the contact piece, while a fixed connection restricts the horizontal and vertical range of movement of the contact piece more effectively. In advantageous embodiments, the conical centring disc is indirectly connected to the underside or the lower shell region of the contact piece, this being achieved by an indirect, movable connection via one or more intermediate pieces. In contrast, in a further embodiment, a direct connection is provided, in which the conical centring disc is fixed, without such intermediate pieces, to the underside and/or in the lower shell region of the contact piece. The centre axis of the interface device to which the contact piece is aligned is the axis of symmetry of the contact piece and/or the helical spring when the interface device is not loaded.

In this embodiment, the frame of the interface device is adapted to the conical shape of the centring disc and thus forms the counterpart to this centring disc. If the interface device is installed in the purging unit without a frame, it is advantageous if the purging unit itself is adapted to the conical shape of the centring disc, rather than the interface device.

Such a centring disc enables the interface device to be realigned after a wafer container has been lifted off and before a new wafer container is received: The helical spring presses the contact piece upwards again, and the conical centring disc finds its counterpart in a corresponding recess of the purging unit, rather than the interface device. This allows the contact piece, for the next docking of a wafer container, maximum possible horizontal mobility in all directions with a vertical force simultaneously acting on it from above, and thereby prevents tilting due to a side impact on its guide. This effectively prevents leaks.

In a further embodiment, the interface device also includes a gas connection device, also called a fitting, which is connected directly to an underside of the contact piece, in particular to the gas inlet or gas outlet on the same, and which contains a hose connection. Such a hose connection is a device for connecting a gas hose and, if necessary, for connecting further constructional aids.

In one embodiment, the purging unit receiving the interface device includes at least one valve, and/or is connected to one, which enables a gas inlet or gas outlet when the wafer container has been placed on the purging unit. In one embodiment, the purging gas supply or discharge is controlled by providing a free/occupied identification (for example, using a placement sensor) in the purge nest, which transmits signals to a data processing unit which then controls the valves for gas supply or gas discharge. This advantageously reduces the mechanical complexity of the interface device. In one embodiment, mechanical valves optionally integrated into the purging interfaces (grommets) of the wafer container are actuated and opened exclusively by gas pressure (back pressure) which arises at these sites in or outside the wafer container during the purging process.

An interface device, the hose connection of which is designed to generate a contact force of the contact piece that is centred along the centre axis of the interface device, with respect to the purging interface of the wafer container, is advantageous.

Furthermore, an interface device is advantageous which is characterized by a gas connection device and/or a hose connection which is designed to keep the force effects of a hose pre-tension as low as possible.

For example, a flexible gas hose, the length of which, measured from the hose connection of the gas connection device of the interface device to the connection device of the gas supply or the suction device, is at least 3 to 4 times longer than the diameter of the interface device, enables a connection to the connecting device of the gas source or the suction device in such a radius that the force exerted by a hose pre-tension on the contact piece is small. The connecting hose is advantageously routed in a radius of at least 90 degrees.

Aligning the hose connection and/or the entire gas connection device according to the alignment of the connection device of the gas source or the suction device is also very advantageous: In this way, both the gas connection device and the hose connection of the interface device, and also the connection device of the gas source or the suction device, may have a vertical gas outlet or gas inlet facing downwards, and/or the hose connection of the interface device and the connection device of the gas source or the suction device may have a horizontal gas outlet or have gas inlet, which are connected to each other by means of the gas hose.

The purging gas is advantageously fed through a bore that extends through the contact piece. In one embodiment, the gas supply and/or discharge is controlled by corresponding valves, which may be arranged, for example, close to the interface device on the purging unit.

The interface device described here may be used in particular in connection with the following types of wafer containers: Entergris A300 FOUP, Entegris Spectra® FOUP, Entegris E200 Pod-Door, ShinEtsu Polymer 300EX AD2 FOUP.

A purging unit according to the invention for purging a wafer container with a purging gas, preferably an inert gas (for example $N_2$, Ar) or extremely clean dry air (XCDA), comprises a kinematic coupling, in one embodiment, a 3-point kinematic coupling, for receiving a wafer container, and at least one interface device according to the invention as described above.

There are now various possibilities for designing and developing the teaching of the present invention in an advantageous manner and/or for combining the embodiments described above—as far as possible—with one another. For this purpose, reference is made on the one hand to the independent claims and the claims subordinate to them, and on the other hand to the following explanation of the exemplary embodiments of the invention with reference to the drawings.

DETAILED DESCRIPTION OF THE PREFERRED EMBODIMENTS

Figure 1:
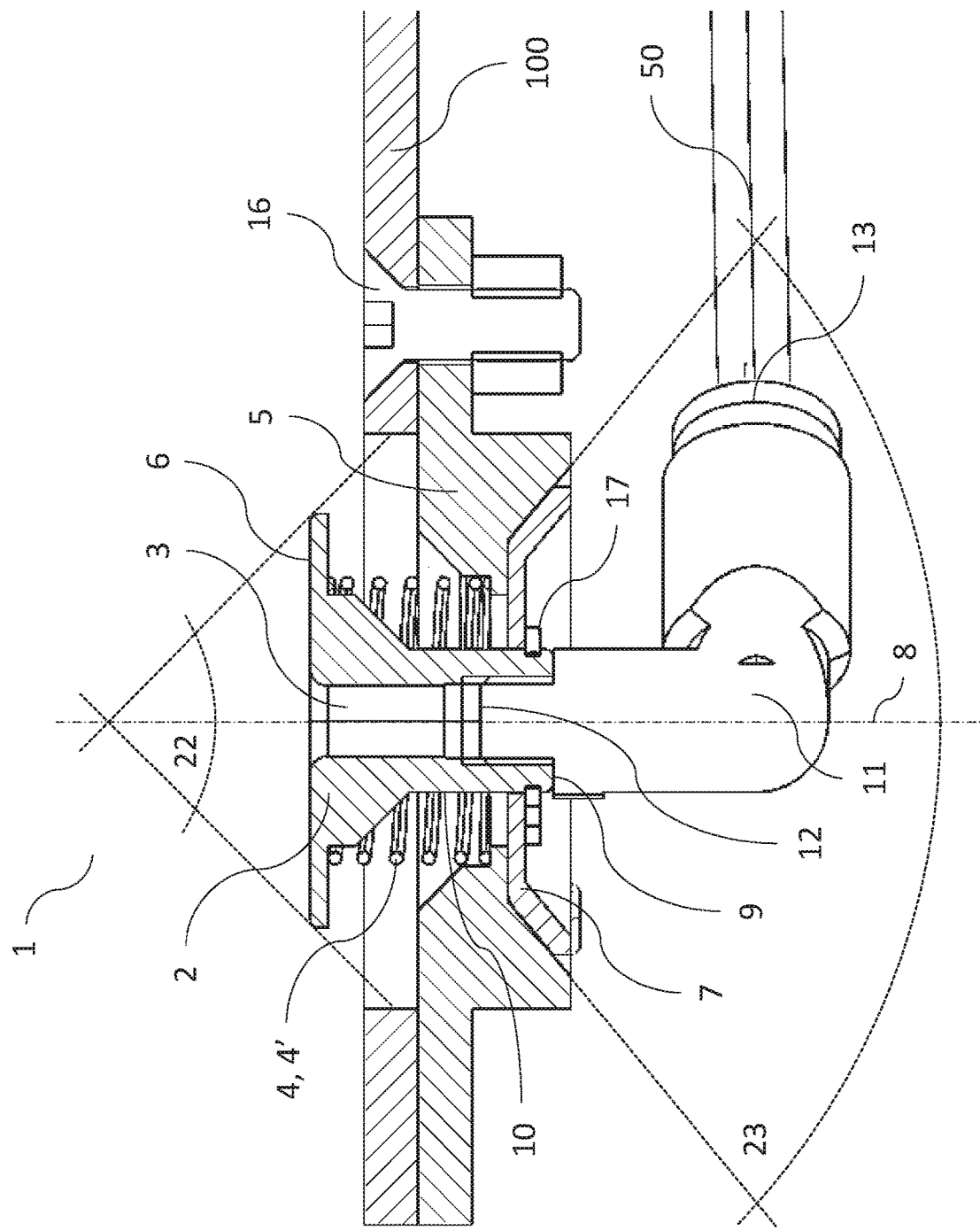
FIG. 1 shows a schematic, sectional view of an exemplary embodiment of an interface device according to the invention, for a purging unit for purging a wafer container, FIG. 1A schematically illustrates the tilting movement 10 of the contact piece, FIG. 1B schematically shows the horizontal movement 21 of the contact piece, FIG. 2 schematically shows an embodiment of the device according to the invention with an interface configuration that provides a hose connection 13 in the axis of the contact piece 2. A bottom view (AU) and/or top view (AO) and a side view (AS) are shown. The movement space n schematically shows the possible movements of the centre axis of the contact piece. For this purpose, two different positions of the contact piece 2 differing from the rest position are shown in a dotted depiction.

FIG. 1 shows an embodiment of an inventive interface device 1 for a purging unit 100 for purging a wafer container with a purging gas, in particular with an inert gas, in a sectional view. The interface device 1 comprises a contact piece 2, which in this case is non-elastic and/or rigid and is indirectly suspended in the purging unit 100 by means of a helical spring 4', that is to say, a special spring device 4, and thus is arranged movably in the purging unit 100. This indirect suspension is implemented via a frame 5: The frame 5 is fastened by means of fastening elements 16, for example by at least two screw connections, in the purging unit 100—and more precisely on a base plate of a purging unit 100. An interface device 1, which, as shown here, comprises a frame 5, has the advantage on the one hand that the individual interface device 1 can be fully assembled before it is inserted into the purging unit 100, and on the other hand such an interface device 1 having a frame 5 can be exchanged much more easily if there is a need for this.

The contact piece 2 with a rotationally symmetrical design around a centre axis 8 has a gas passage 3 in its interior. This extends from a top side 6 of the contact piece 2 to an underside 9 of the contact piece 2. The entire—here, circular—top side 6 of the contact piece 2 is designed as a flat surface which is only interrupted by the gas passage 3 in a small radius around its centre point. When this flat surface comes into contact with a rubber-like purging interface of a wafer container, there is high static friction between these parts from this moment on. As a result, the purging interface of the wafer container can no longer move further over the top side 6 of the contact piece 2 but nestles against the top side 6 of the contact piece 2, such that any further movement of the wafer container is adapted from this moment forward by the contact piece 2 suspended movably in the frame 5 of the interface device 1, such that the contact piece 2 moves synchronously with the FOUP.

Figure 1B:
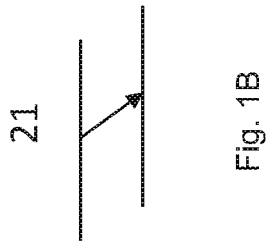
Figure 1A:
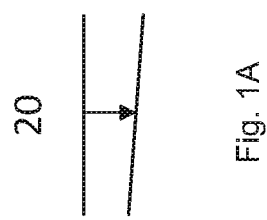

In order to implement a movable suspension, in particular, a movable suspension which allows the contact piece 2 to execute a tilt movement 20 (FIG. 1*a*) to adapt to a tilt of the purging interface of the wafer container in relation to the contact piece 2, or to execute a horizontal movement 21 (FIG. 1*b*) to adapt to a horizontal displacement of the wafer container in relation to the contact piece 2, or a combination of both, the contact piece 2 is inserted into a conically shaped opening in the frame 5 of the interface device 1 by means of a helical spring 4'. This allows the wafer container to be received, and/or a coupling with the wafer container over an angular range 22 of up to 90° and/or with a vertical movement tilted up to 45°, which may occur when the kinematic coupling is being aligned. In order to minimize undesired friction between the centring disc 7 and the conical receptacle of the frame 5 when the vertical movement of the contact piece 2 is at a maximum tilt, the angular range 23 with an opening angle greater than 90° is made greater, than the angular range 22.

In order to align the contact piece 2 in the frame 5 along the centre axis 8 of the contact piece 2, and to align the entire interface device 1 when a wafer container placed on the interface device 1 is lifted off again and the helical spring 4' is once again unloaded as a result, the interface device shown in this case comprises a conical centring disc 7. In this case, the conical centring disc 7 is movably connected indirectly via the retaining disc 17 via the lower shell region 10 of the contact piece 2 to the same. It finds its counterpart in a correspondingly shaped opening in the frame 5 of the interface device 1. When the helical spring 4' with the contact piece 2 is once again unloaded when the wafer container is lifted off, the conical centring disc 7 nestles accordingly into the opening of the frame 5 of the interface device 1.

The interface device 1 further comprises a gas connection device 11. The gas connection device 11 is connected directly to the underside 9 of the contact piece 2, and in particular to a gas inlet or a gas outlet 12 on the underside 9 of the contact piece 2. The gas connection device 11 further comprises a hose connection 13 into which a gas hose 50 can be fastened, via which the purging gas can be led into and out of the interface device 1. The hose connection 13 is aligned with a connection device 110 of a gas source or a suction device of the purging unit 100 such that a contact force of the contact piece 2 centred along the centre axis 8 of the interface device 1 can be generated against the purging interface of the wafer container.

Figure 2:
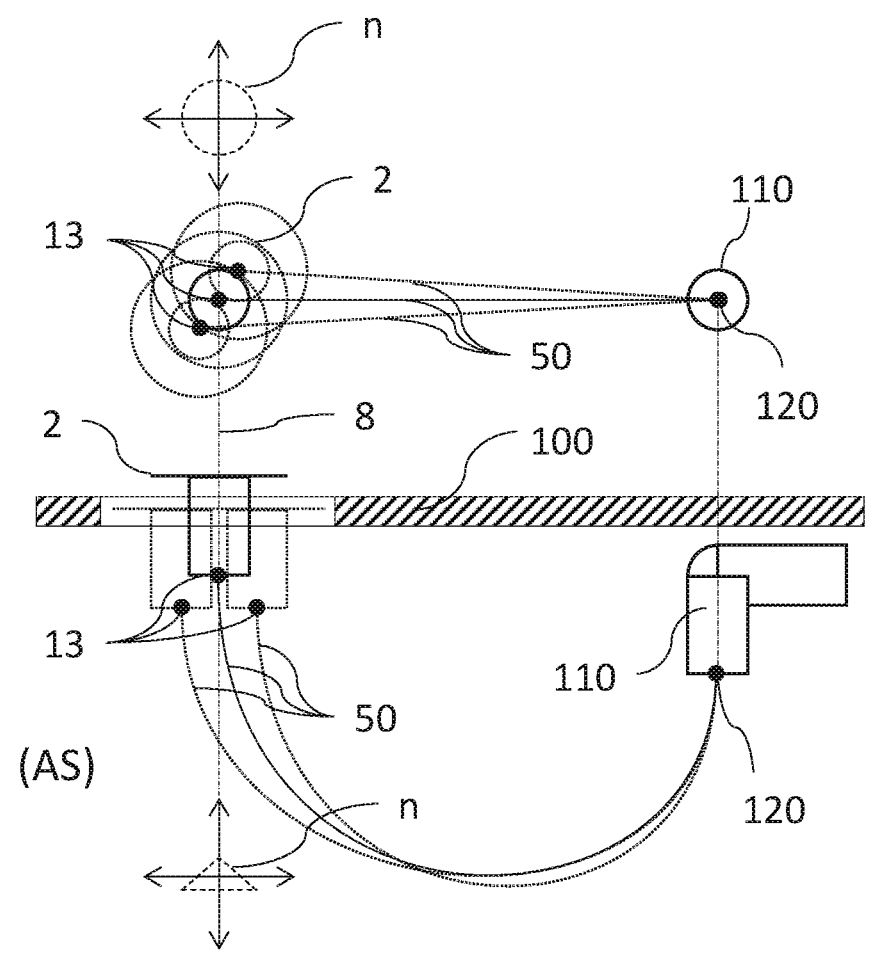
Figure 3:
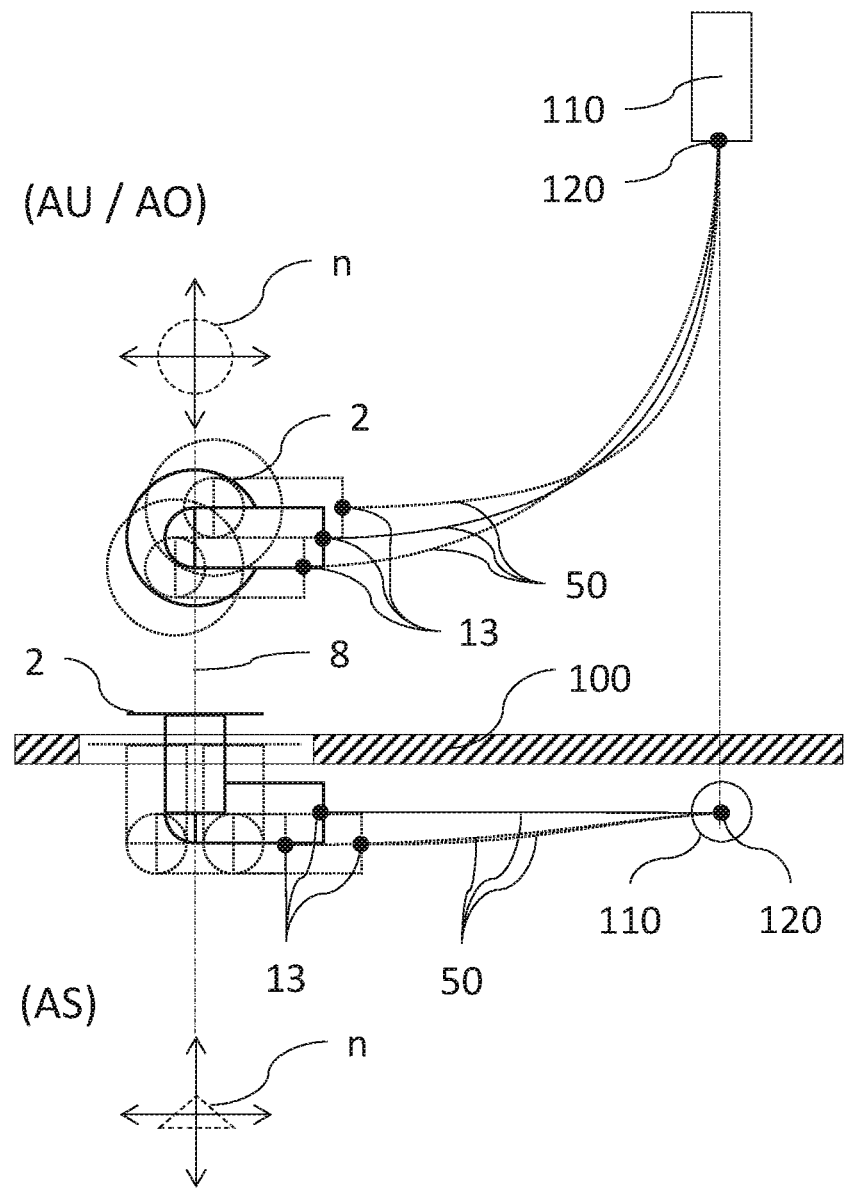
FIG. 3 schematically shows an embodiment of the device according to the invention, with an angled hose connection 13. A bottom view (AU) and/or top view (AO) and a side view (AS) are shown. The movement space n schematically shows the possible movements of the centre axis of the contact piece. For this purpose, two different positions of the contact piece 2 differing from the rest position are shown in a dotted depiction.
Figure 4:
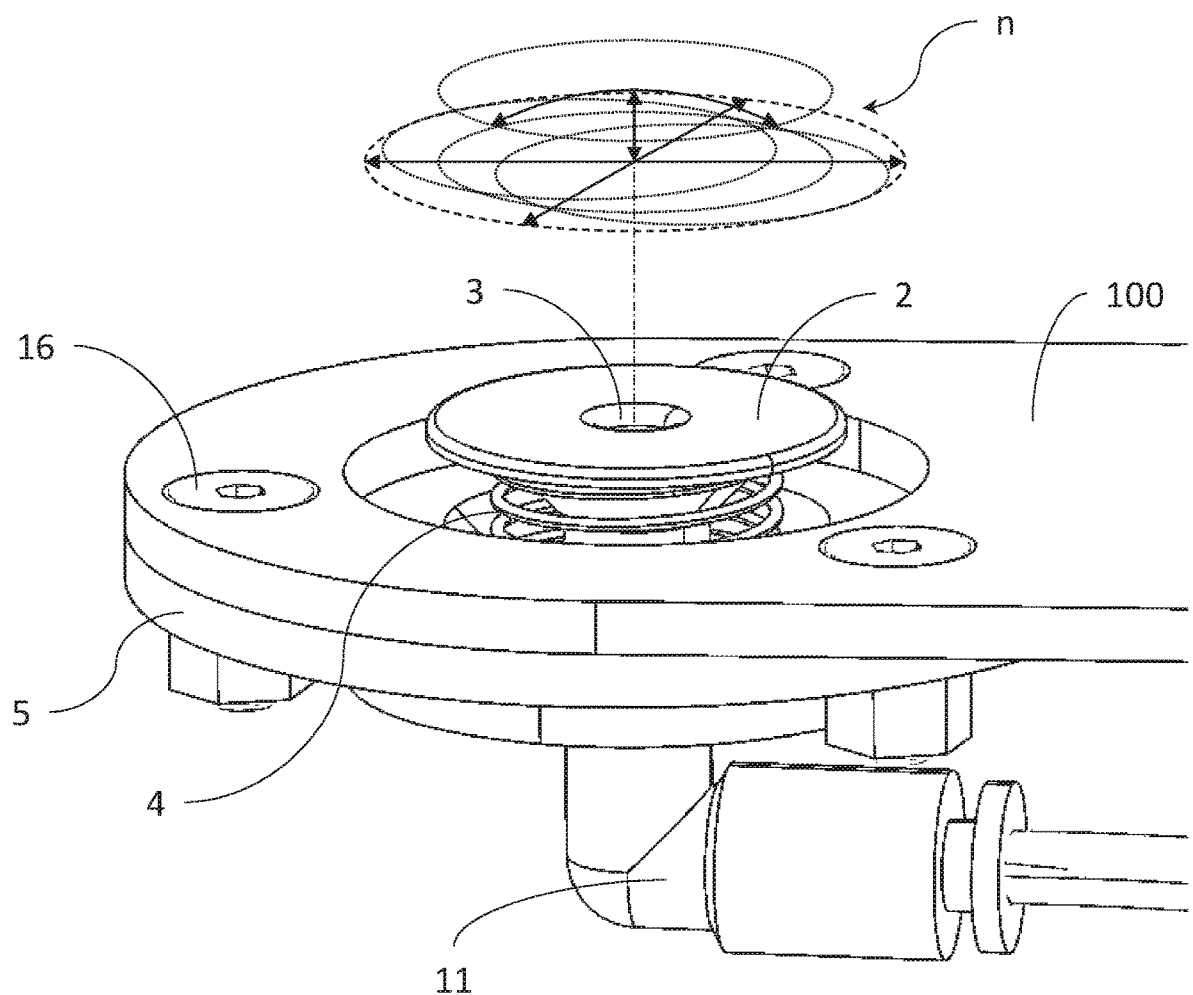
FIG. 4 shows a schematic, perspective view of the device according to the invention. The movement space n of the contact piece 2 is symbolized by the inserted coordinate system.

FIGS. 2 and 3 show two embodiments of an interface device 1 according to the invention in connection with the associated connection device 110 of a gas source or gas extraction for a purging unit 100 for purging a wafer container with a purging gas, in a view from below (AU) and above (AO), and a view from the side (AS). These illustrate, in particular, how a contact force of the contact piece 2, which is largely centred along the centre axis 8 of the interface device 1, can be generated via the hose connection 13 against the purging interface of the wafer container, and how a force produced by a hose pre-tension can be kept low.

The features of the interface device 1 of a second exemplary embodiment may correspond to the features of the interface device 1 of the first exemplary embodiment, and/or the same may be configured differently in some cases: For example, the interface device 1 may also be fitted directly into the purging unit 100 without a frame 5.

In order to keep a force on the contact piece 2 caused by a hose pre-tension low, a flexible gas hose 50 is used in this case as well, the length of which, measured from the hose connection 13 of the gas connection device 11 of the interface device 1 to the connection device 110 of the gas source or the pump device, is at least an order of magnitude greater than that of the interface device 1.

LIST OF REFERENCE NUMERALS

1 Interface device
10 Shell region of the contact piece
100 Purging unit
11 Gas connection device
110 Connection device
12 Gas inlet or gas outlet
120 Hose connection on the connection device
13 Hose connection on the contact piece
16 Fastening element
17 Retaining disc
2 Contact piece
20 Tilt movement
21 Horizontal movement
22 Angular range
23 Angular range
3 Gas passage
4 Spring device
4' Helical spring
5 Frame
50 Flexible gas hose
6 Fop side of the contact piece
7 Centring disc
8 Centre axis
9 Underside of the contact piece
n Range of motion
AU Bottom view
AO Top view
AS Side view

The invention claimed is:

1. An interface device (1) for a purging unit (100) for purging a wafer container with a purging gas, comprising a contact piece (2) for contacting a purging interface of a wafer container, wherein the contact piece (2) is arranged in the purging unit (100) in a manner allowing movement in all axes, and has a gas passage (3) in its interior, characterized in that the contact piece (2) is suspended directly or indirectly in the purging unit (100) by means of a spring device (4).

2. The interface device (1) according to claim 1, further comprising a frame (5) for attaching the interface device (1)

to the purging unit (100) and for receiving the spring device (4) for suspending the contact piece (2).

3. The interface device (1) according to claim 1, characterized in that the contact piece (2) is configured to generate high static friction to the purging interface of the wafer container, so that is can change its position without any movement relative to the purging interface of the wafer container.

4. The interface device (1) according to claim 1, characterized in that the contact piece (2) has a top side (6) which comprises a flat surface, in particular a flat, polished stainless steel type surface.

5. The interface device (1) according to claim 1, further comprising a conical centring disc (7) for aligning the contact piece (2) in the purging unit (100) or, in the frame (5) of the interface device (1), along a centre axis (8) of the interface device (1), wherein the conical centring disc (7) is connected directly or indirectly to an underside (9) and/or a lower shell region (10) of the contact piece (2).

6. The interface device (1) according to claim 1, further comprising a gas connection device (11) which is directly or indirectly connected to an underside (9) of the contact piece (2), in particular with a gas inlet or gas outlet (12) on the underside (9) of the contact piece (2), and which contains a hose connection (13).

7. The interface device (1) according to claim 6, characterized by a hose connection (13) which is designed to enable a contact force of the contact piece (2) against the purging interface of the wafer container, centred along the centre axis (8) of the interface device (1).

8. The interface device (1) according to claim 6, characterized by a gas connection device (11) and/or a hose connection (13) which, in connection with the gas connection device (110) of the gas source and the gas hose (50), is designed to keep the force of a hose pre-tension low.

9. A purging unit (100) for purging a wafer container with a purging gas, comprising a kinematic coupling for receiving a wafer container, and at least one interface device (1) according to claim 1.

* * * * *